(12) United States Patent
Huang et al.

(10) Patent No.: US 10,741,850 B2
(45) Date of Patent: Aug. 11, 2020

(54) DUAL CONDUCTOR SURFACE MODIFIED SOFC CATHODE PARTICLES AND METHODS OF MAKING SAME

(71) Applicants: Kevin Huang, Columbia, SC (US); Jeffrey F. Roeder, Bethel, CT (US); Anthony F. Zeberoff, Bethel, CT (US)

(72) Inventors: Kevin Huang, Columbia, SC (US); Jeffrey F. Roeder, Bethel, CT (US); Anthony F. Zeberoff, Bethel, CT (US)

(73) Assignee: Sonata Scientific LLC, Bethel, CT (US)

( * ) Notice: Subject to any disclaimer, the term of this patent is extended or adjusted under 35 U.S.C. 154(b) by 547 days.

(21) Appl. No.: 15/374,981

(22) Filed: Dec. 9, 2016

(65) Prior Publication Data

US 2017/0170485 A1    Jun. 15, 2017

Related U.S. Application Data

(60) Provisional application No. 62/265,076, filed on Dec. 9, 2015.

(51) Int. Cl.
| | |
|---|---|
| H01M 4/88 | (2006.01) |
| H01M 4/86 | (2006.01) |
| H01M 8/124 | (2016.01) |

(52) U.S. Cl.
CPC ....... H01M 4/8889 (2013.01); H01M 4/8663 (2013.01); *H01M 2004/8689* (2013.01); *H01M 2008/1293* (2013.01)

(58) Field of Classification Search
None
See application file for complete search history.

(56) References Cited

U.S. PATENT DOCUMENTS

| | | | | |
|---|---|---|---|---|
| 2010/0098996 | A1* | 4/2010 | Hwang | H01M 4/8621 429/454 |
| 2010/0227476 | A1* | 9/2010 | Peck | C23C 16/40 438/680 |
| 2012/0009504 | A1* | 1/2012 | Ramanathan | H01M 4/8621 429/532 |
| 2013/0059073 | A1* | 3/2013 | Jiang | C23C 16/4417 427/212 |
| 2013/0337369 | A1* | 12/2013 | Rosseinsky | C04B 35/01 429/527 |
| 2014/0302420 | A1* | 10/2014 | Wachsman | H01M 4/9033 429/489 |

(Continued)

OTHER PUBLICATIONS

A.J. Jacobson, Materials for Solid Oxide Fuel Cells, Chem. Mater., 2010, 660-674, vol. 22.

(Continued)

*Primary Examiner* — Rena Dye Cronin
(74) *Attorney, Agent, or Firm* — Gregory Stauf

(57) ABSTRACT

A novel method to produce ALD films disposed on powders is disclosed. Examples include the formation of a cobalt doped zirconia (CDZ), hafnia, and cobalt doped hafnia (CDH) films on lanthanum strontium cobalt iron oxide (LSCF) powder for solid oxide fuel cell cathodes. The coated powders are sintered into porous cathodes that have utility for preventing the migration of cations in the powder to the surface of the sintered cathode and/or other performance enhancing attributes.

20 Claims, 15 Drawing Sheets

(56) References Cited

U.S. PATENT DOCUMENTS

| | | | |
|---|---|---|---|
| 2015/0162621 A1* | 6/2015 | Nada | C01G 51/68 |
| | | | 502/303 |
| 2016/0043387 A1* | 2/2016 | Kalaiselvi | H01M 4/366 |
| | | | 429/223 |
| 2017/0137940 A1* | 5/2017 | Zeberoff | C23C 16/45557 |
| 2018/0093229 A1* | 4/2018 | Yildiz | H01M 4/9033 |

OTHER PUBLICATIONS

T.T. Fister, D.D. Fong, J.A. Eastman, P.M. Baldo, M.J. Highland, P.H. Fuoss, K.P. Balasubramaniam, J.C. Meador, P.A. Salvador, In situ characterization of strontium surface segregation in epitaxial La0.7Sr0.3MnO3 thin films as a function of oxygen partial pressure, Appl. Phys. Lett., 2008, 151904, vol. 93.

M. Liu, D.Ding, K. Blinn, X. Li, L. Nie, M.Liu, Enhanced performance of LSCF cathode through surface modification, Int. J. Hydrogen Energy, 2012, 8613-8620, vol. 37.

Y. Gong, R.L. Patel, X. Liang, D. Palacio, X. Song, J.B. Goodenough, K. Hwang, Atomic Layer Deposition Functionalized Composite SOFC Cathode La0.6Sr0.4Co0.2O3-δ-Gd0.2Ce0.8O1.9 : Enhanced Long-Term Stability, Chem. Mater. 2013, 4224-4231, vol. 25.

Y. Gong, D. Palacio,X. Song, R.L. Patel, X. Liang, X. Zhao, J.B. Goodenough, K. Hwang, Stabilizing Nanostructured Solid Oxide Fuel Cell Cathode with Atomic Layer Deposition, Nano Lett., 2013, 4340-4345, vol. 13.

D. Ding, X. Li, S. Lai, K. Gerdes, and M. Liu, Enhancing SOFC cathode performance by surface modification through infiltration, Energy Environ. Sci., 2014, 552-575, vol. 7.

* cited by examiner

FIG. 11

| Powder treatment | Pore volume (porosity) of sintered cathode (%) |
|---|---|
| uncoated LSCF | 40.9 |
| 12 cycles CDZ | 38.6 |
| 24 cycles CDZ | 38.2 |

FIG. 14

| Cathode | Total polarization at 800°C ($\Omega$–cm$^2$) | Total polarization at 700°C ($\Omega$–cm$^2$) | Total polarization at 600°C ($\Omega$–cm$^2$) |
|---|---|---|---|
| LSCF (uncoated) | 0.049 | 0.288 | 2.614 |
| ZrO$_2$ coated LSCF | 0.038 | 0.190 | 1.551 |
| CDZ coated LSCF (12 ALD cycles) | 0.019 | 0.075 | 0.605 |
| CDZ coated LSCF (24 ALD cycles) | 0.022 | 0.097 | 0.834 |

FIG. 15

| Cathode | Relative Change in Total polarization at 800°C ($\Omega\text{-cm}^2$) | Relative Change in Total polarization at 700°C ($\Omega\text{-cm}^2$) | Relative Change in Total polarization at 600°C ($\Omega\text{-cm}^2$) |
|---|---|---|---|
| LSCF (uncoated) | --- | --- | --- |
| $ZrO_2$ coated LSCF | -22% | -34% | -41% |
| CDZ coated LSCF (12 ALD cycles) | -61% | -74% | -77% |
| CDZ coated LSCF (24 ALD cycles) | -55% | -68% | -68% |

DUAL CONDUCTOR SURFACE MODIFIED SOFC CATHODE PARTICLES AND METHODS OF MAKING SAME

This invention was made with Government support under contract SC-0013116 awarded by the U.S. Department of Energy. The government has certain rights in this invention.

CROSS REFERENCE TO RELATED APPLICATIONS

U.S. Provisional Patent Application 62/265,076, filed Dec. 9, 2015, herein incorporated by reference.

BACKGROUND OF THE INVENTION

REFERENCES

Provisional application Ser. No. 62/192,033, "Surface Modified Cathode Particles and Method of Making Same", filed Jul. 13, 2015, and any continuations thereof. Provisional application Ser. No. 62/254,431, "Apparatus and Method for Coating Bulk Quantities of Solid Particles", filed Nov. 12, 2015, and any continuations thereof. Also see IDS filed with this application for additional references.

SUMMARY DISCLOSURE OF INVENTION

The present invention relates to the formation of barrier layers on cathode powders used to make solid oxide fuel cell (SOFC) cathodes to reduce migration of cations to the cathode surface and/or to improve performance and long term reliability of the SOFC.

DESCRIPTION OF THE RELATED ART

Solid oxide fuel cell (SOFC) technology represents an efficient means to utilize a variety of fossil fuels, with exceptional promise for reduced carbon footprint. Although commercial systems are starting to be deployed, significant improvements are needed. Increasing the performance of a SOFC would reduce costs. One key indicator of SOFC performance is electrochemical polarization, which may be characterized for a complete cell or for anodes (cathode or anode). The lower the polarization, the lower the losses in converting fuel species to electrical energy. Improvements to cathode performance are particularly sought after. Improvements of total polarization of a cathode of 10% are significant, 25% very significant, and 50% extremely significant.

Strontium based ceramic cathodes e.g., lanthanum strontium manganese oxide (LSM) and lanthanum strontium iron cobalt oxide (LSFC) have been examined extensively for use in solid oxide fuel cells (SOFCs). LSM has high electronic conductivity and low $O_2$ electrochemical activity, while LSCF offers both high electrical and ionic conductivity, leading to high $O_2$ electrochemical activity. Hence, LSCF has become a primary choice for SOFC cathodes. Performance of LSCF is very good, but cathode degradation occurs during operation at elevated temperatures, limiting the operating lifetime of the SOFC. Although significant work has been carried out to examine alternatives, LSCF cathodes remain predominant due to their combination of good ionic and electronic conductivity, as well as sintering temperatures favorable for anode supported fabrication schemes. Consensus is building that Sr migration to the LSCF surface is a key issue for degradation of the cathode.

Recently, surface modification after sintering has been shown to improve performance and the stability of fabricated LSCF cathodes. Known as "infill", a coating is applied via a solution route to the cathode after fabrication of the SOFC stack. In the case of an LSCF backbone with an LSM infilled coating, performance was significantly enhanced, and Sr surface enrichment was not observed. The coating may also be produced by atomic layer deposition (ALD).

While an infilled cathode arguably represents the state of the art, it is viewed by some as an extra process step in the fabrication process for SOFC manufacturers. An alternative is to utilize improved, surface modified cathode powders with a core-shell type structure that could provide the benefits of surface modification of a fully processed cathode but in a raw cathode powder that can act as a drop in replacement for existing cathode powders to create an infill-like cathode microstructure. This would be a great advantage, streamlining the manufacturing process by eliminating the need for a post-fabrication infill process.

Accordingly, it would be a significantly advantageous improvement to produce a highly controlled surface layer on SOFC cathode powders. In particular, it would be highly advantageous to utilize a surface layer with dual conducting properties, e.g., using materials with both ionic and electronic conduction mechanisms. Similar to the core material, LSCF, such materials could be termed "dual conductors".

BRIEF DESCRIPTION OF THE DRAWINGS

FIG. 11 shows pore volumes from cathodes sintered from uncoated and surface modified cathode powders sintered under the same conditions.

FIG. 14 shows electrochemical polarization of symmetrical electrochemical cells at various operating temperatures with cathodes made from uncoated and several ALD surface modified LSCF powders.

FIG. 15 shows relative changes in of electrochemical polarization symmetrical electrochemical cells at various operating temperatures with cathodes made from several ALD surface modified LSCF powders compared to those from uncoated powders.

DETAILED DESCRIPTION OF THE INVENTION, AND PREFERRED EMBODIMENTS THEREOF

Figure 1:
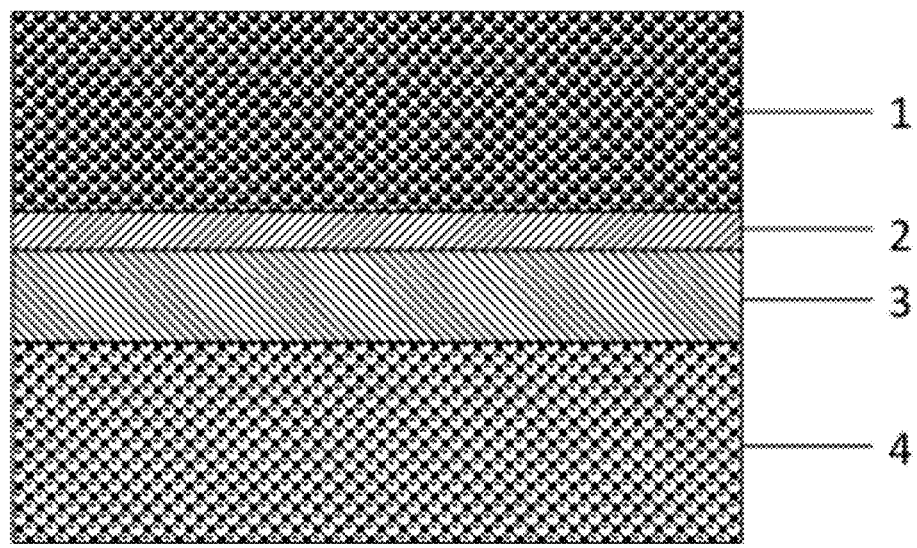
FIG. 1 is a schematic of an SOFC structure.
Figure 2:
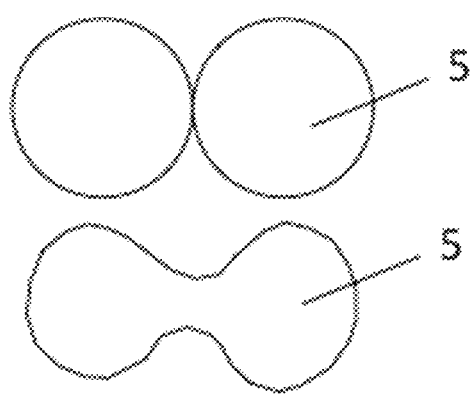
FIG. 2 is a schematic of ALD process growth rate per cycle as a function of temperature.

The present invention relates to the fabrication of oxide based ceramic or ceramic barrier films or performance enhancing films on SOFC cathode powders by ALD that may be sintered to form porous SOFC cathodes and methods to perform controlled deposition. A schematic of an SOFC device is shown in FIG. 1 comprising a porous cathode 1, barrier layer 2, electrolyte 3, and porous anode 4. The porous cathode is made by sintering a cathode powder under conditions that permit interconnection of the particles, typically evidenced by necking, yet maintaining an open structure into which gas may diffuse. A schematic of two particles forming a unit of such a structure is shown in FIG. 2, where the particles of cathode powder 5 are joined during the sintering process. It is important, therefore, that the surface coating on the cathode powder not interfere significantly with the sintering behavior of the cathode to form the desired pore volume and pore size distributions. Staying within a margin of 30% of the standard pore size and pore size distribution, preferably 20%, and most preferably 10% should not affect the ability of the cathode to allow oxygen to diffuse into the structure and react at the surface to form oxygen ions which then diffuse though the solid portions of the cathode for reaction within the electrolyte with hydrogen fuel ions.

In one aspect, the invention relates to the use of ALD to deposit zirconium (Zr) or hafnium (Hf) oxide based films. Alloying additions to the ceria films include conductivity enhancing transition metal elements such as cobalt (Co), iron (Fe) and nickel (Ni). Interlayers may also be added, for example, aluminum oxide ($Al_2O_3$) or rare earth oxides (e.g. $Gd_2O_3$, $CeO_2$, $La_2O_3$, $Pr_2O_3$) forming a nanolaminate structure. The oxide ALD process uses pulses of a metal cation containing precursor and an oxidizing agent. The pulses are separated by pulses of inert gas to prevent reaction in the gas phase. A series of pulses characterized by a precursor dose pulse, purge pulse, oxidizer pulse, and purge pulse is known as an ALD cycle. In the case of multicomponent oxide films, a super cycle is imposed, where there is a systematic change of the cation in the precursor dose according to the desired ratio of two or more cations. Using cations A and B as examples, the super cycle could be A, B, A, B, etc. or A, A, B, A, A, B, etc. up to any desired ratio of A to B. The process may be carried out under constant flow, or the gas flow may be stopped at intervals during dosing to allow diffusion of species. Further, changes in vacuum level (pressure) may be applied during the pulse cycles.

Metalorganic precursors for zirconium, hafnium, cobalt, iron, and nickel include a number of metalorganic compounds, including ketonates, alkoxides, amides, amidinates, guanidinates, and cyclopentadienyls. In general, many of these compounds are useful for ALD. Specifically, amides of Zr show excellent reactivity with water as an oxidizing agent. Useful amide sources for Zr include tetrakisdimethylamido Zr (TDMAZ), tetrakisdiethylamido Zr (TDEAZ), and tetrakisethylmethylamido Zr (TEMAZ). Useful amide sources for Hf include tetrakisdimethylamido Hf (TDMAH), tetrakisdiethylamido Hf (TDEAH), and tetrakisethylmethylamido Hf (TEMAH). Cobalt, iron, and nickle sources with good reactivity for water include amidinates, e.g., bis(N,N'-di-i-propylacetamidinato) Co, bis(N,N'-di-t-butylacetamidinato) Fe, and bis(N,N'-di-t-butylacetamidinato) Ni. Metallocenes, carbonyls, and mixed ligand precursors of Co, Fe, and Ni comprised of the same may be used. Halides may also be used. Examples include $ZrCl_3$, $HfCl_3$, $CoI_2$ and $FeCl_3$. Other oxidants may include ozone or oxygen plasma.

ALD may be carried out with solid or liquid sources held in bubblers through which a carrier gas is flowed to convey the source to the deposition chamber. The sources may also be dissolved in an organic solvent as individual sources or combined together. Key criteria of a solvent system are (1) high boiling point to reduce the chance of flash off of the solvent, (2) high solubility for the compound, (3) low cost. Useful hydrocarbon solvents may include, for example: octane, decane, isopropanol, cyclohexane, tetrahydrofuran, and butyl acetate or mixtures comprising these and other organic solvents. Lewis base adducts may also be incorporated as additions to the solvent(s) for beneficial effects on solubility and to prevent possible oligimerization of the precursor molecules. Examples of useful Lewis Bases include polyamines polyethers, crown ethers, and the like. Pentamethylenediamine is a one example of a polyamine. Examples of polyethers include various glymes such as mono-, di-, tri-, and tetraglyme.

Figure 3:
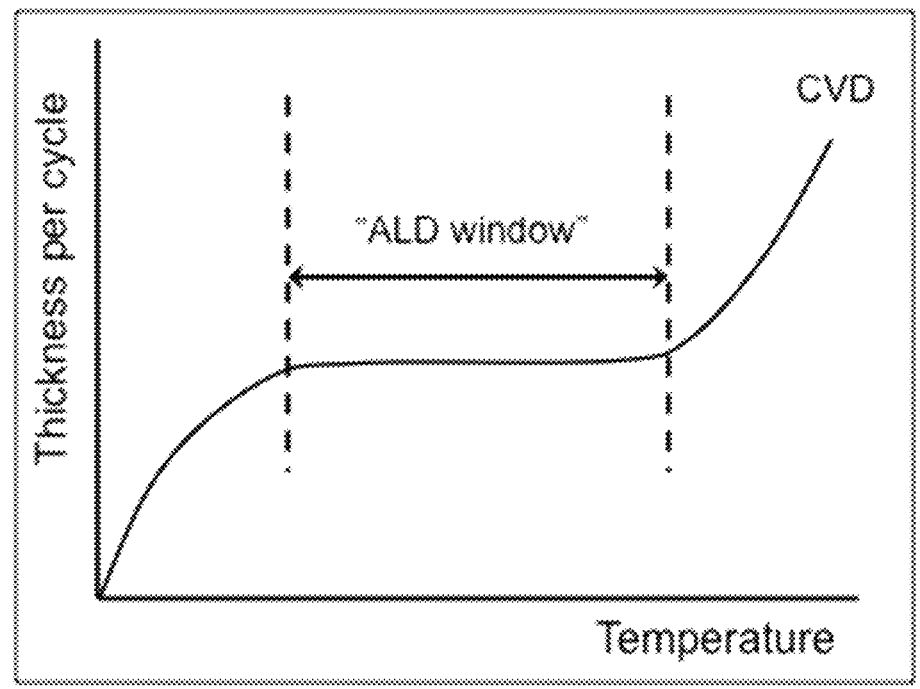
FIG. 3 is a schematic of a sintered structure formed from two particles.

Turning to the deposition process, we note that most ALD processes exhibit what is known as an ALD window with respect to temperature. In this temperature range, growth of the film is surface monolayer saturation limited (FIG. 3). The practical result is that deposition (thickness) per ALD cycle is the same, as long as sufficient material is provided to the surface. After saturation, further supply of material in the gas phase does not increase growth per cycle. The primary objective in the present invention is the formation of a film with highly controlled nanostructure. Crystallinity is also preferred. The upper end of the ALD window temperature range offers a good mix of conformality and the potential for good crystallinity. The lower end of the ALD temperature range window offers the potential for island type growth. Post-deposition annealing in an oxygen containing atmosphere may also be used to promote crystallinity in the film. Accordingly, different regions of the ALD temperature range may be used to create different structures.

Figure 4:
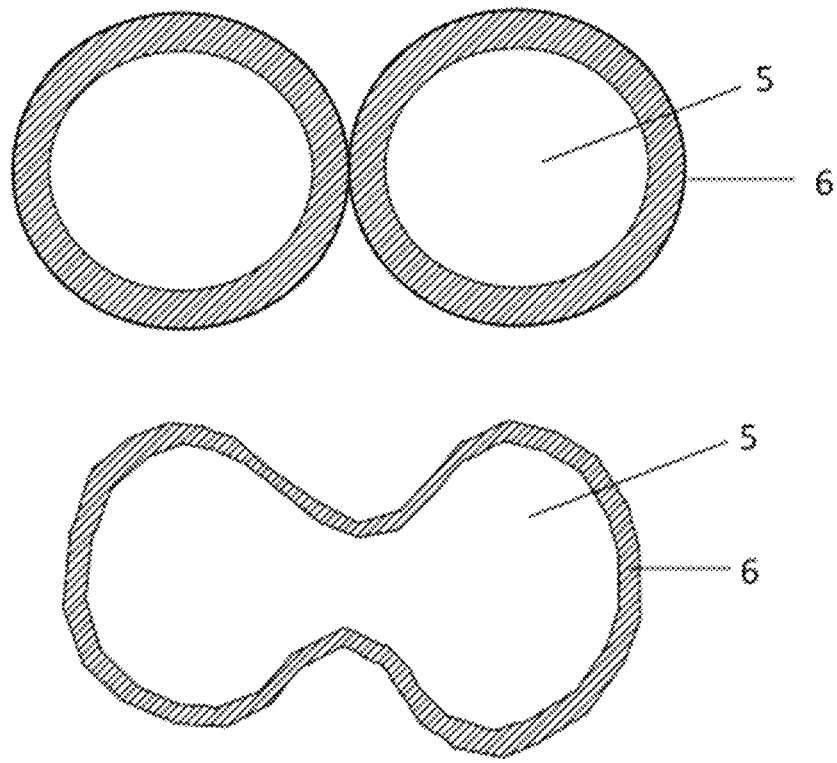
FIG. 4 is a conceptual drawing of a surface modified powder and sintered structure of two example particles to form a barrier coated SOFC cathode.
Figure 5:
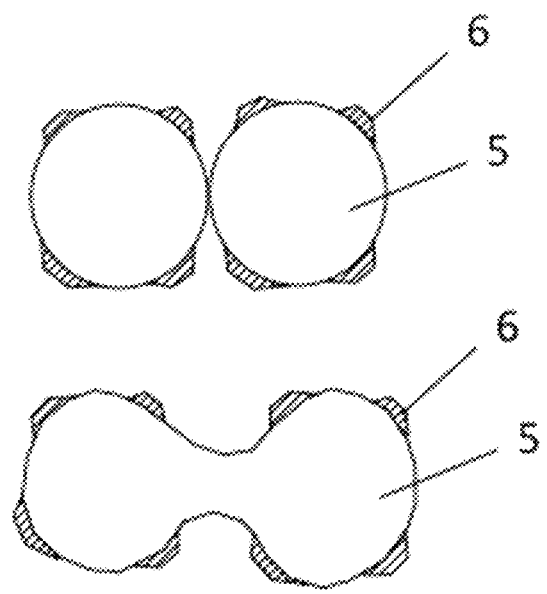
FIG. 5 is a schematic of a discontinuous surface coating on particles and subsequent sintered cathode structure.
Figure 6:
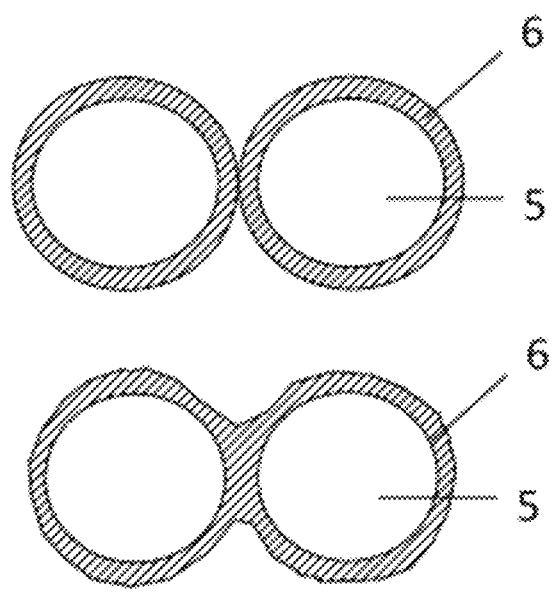
FIG. 6 is a schematic of a continuous surface coating on particles and subsequent sintered cathode structure.

One objective of coating the particles is to create a surface modified particle that may be sintered onto a solid porous cathode for an SOFC. In the case where a continuous coating, or shell 6 is created on the particles 5, and then sintered, a structure similar to an infilled cathode may be produced (FIG. 4). Other coating nanostructures may be achieved by ALD, including cases wherein only portions of the particles are coated with the surface modifying layer. As noted earlier, ALD carried out at the lower end of the ALD temperature window or at temperatures slightly below that defining the lower end of the ALD window may result in island growth. ALD carried out in the ALD window result in uniform coating that may be controlled at the atomic level by controlling the number of cycles. Powders with these nanostructured coatings may be sintered to form a solid structure. Depending on the coating thickness, different final structures may be obtained. FIG. 5 shows one example of microstructure evolution starting with a discontinuous surface layer 6 on the particle 5 and a porous sintered structure with numerous surface regions of the shell material. Another example is a structure where the coating forms the interconnecting web 6 and cathode particles 5 (FIG. 6).

In the case of a cation migration blocking layer, a substantially continuous coating may be advantageous. This may be achieved with a continuous shell that may potentially crack open during the sintering process. The shell may also stay intact during sintering. For performance enhancement, a discontinuous coating may be preferred that results in so-called triple phase boundaries (TPBs) at various locations on the surface of the sintered cathode. An example of such a structure could be LSM nodules on an LSCF powder, optionally with a cation migration blocking layer below the LSM nodules. Another example could be a discontinuous CDZ layer or other transition metal doped zirconia or hafnia layer, coating only portions of powder particles. Performance may be reflected in terms of electrochemical polarization behavior of the cathode, which may be evaluated in a complete fuel cell (anode/electrolyte/cathode) or in a symmetrical cell (cathode/electrolyte/cathode). Typically, a reaction barrier is placed at the electrolyte/cathode interface, as indicated by layer 2 in FIG. 1. The reaction barrier is often a cerium based oxide, for example gadolinium doped ceria or samarium doped ceria. The dopants expand the crystal lattice slightly to improve ionic transport of oxygen to the electrolyte.

It will be appreciated that the shell material may interact with the normal sintering process of an uncoated powder. The coating may have a similar, higher or lower sintering temperature compared to the core powder depending upon the desired final structure. Suitable performance enhancing, degradation reducing, and/or migration blocking layers with dual conductivity mechanisms include cobalt doped zirconia, iron doped zirconia, nickel doped zirconia, cobalt doped hafnia, iron doped hafnia, nickel doped hafnia, and combinations thereof. Similarly doped tantalates and niobates may also be useful.

Figure 7:
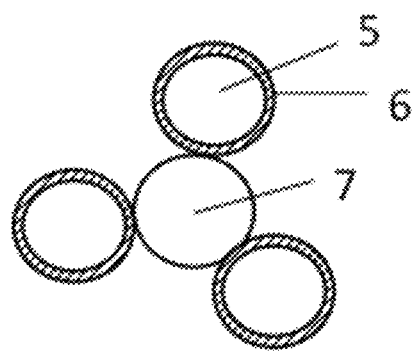
FIG. 7 is a schematic of a hybrid approach to form a sintered cathode from a mixture of coated and uncoated particles.
Figure 7:
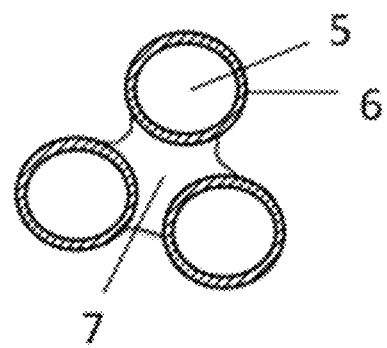
Figure 8:
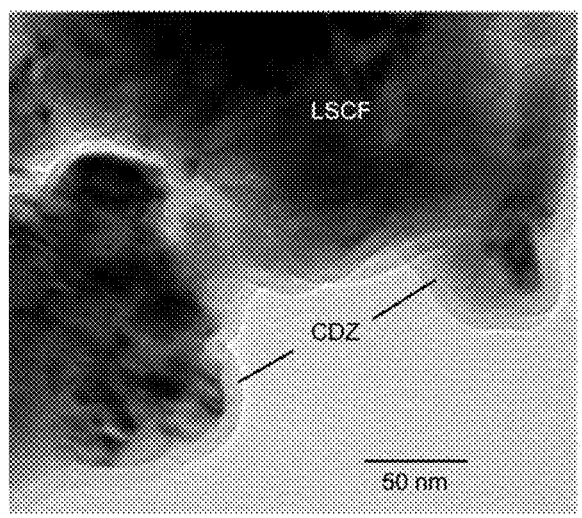
FIG. 8 is a transmission electron image of a lanthanum strontium cobalt iron (LSCF) oxide particle coated with cobalt doped zirconia (CDZ) by ALD.

A hybrid approach may also be employed, where a sintered cathode is made up from a portion of the cathode powder is coated and another portion is uncoated. A sintered structure would consist of a network of uncoated powder 7 binding together the coated powder with its respective shell 6 and core 5 (FIG. 7). This may be advantageous in the case where the sintering temperature of the shell material is high.

Process conditions favorable for ALD of zirconia, and hafnia based films are in the temperature range of 150-350° C. with pressures in the range of 1-5 Torr. Surface preparation (termination) can be very important to enhance nucleation in an ALD process. Pre-treatments to promote uniform nucleation include aqueous acids/bases compatible with the substrate and that result in —H or —OH termination of the substrate surface.

Embodiments for ALD of cathode enhancing SOFC films on cathode powders are described in the following examples. The deposition system may have an automated throttle valve that allows pressure to be controlled independently of flow. In this way, residence times can be manipulated more directly. The hot-wall type reactor is one type of reactor that may be used to deposit the subject films. Fluidized beds, rotating reactor, or levitating gas flows may also be used, optionally with other means of agitation.

Example 1

A cobalt doped zirconia (CDZ) film is deposited on LSCF held as a loosely packed bed in a porous cup using tetrakisdimethylamido zirconium (TDMAZ) and bis(N,N'-di-i-propylacetamidinato) Co at 240° C. Reactor pressure is 1 Torr. Dose times for TDEAZ, bis(N,N'-di-i-propylacetamidinato) Co and water vapor are 60 seconds. Purge times are 120 seconds. Nitrogen is used to transport the precursors to the deposition chamber and as the inert purge. 60 ALD cycles are used to deposit the film, with a ratio of 6 Zr cycles to 1 Co cycle.

Example 2

A cobalt doped zirconia (CDZ) film is deposited on LSM held as a loosely packed bed in a porous cup using tetrakisdimethylamido zirconium (TDMAZ) and bis(N,N'-di-i-propylacetamidinato) Co at 240° C. Reactor pressure is 1 Torr. Dose times for TDMAZ, bis(N,N'-di-i-propylacetamidinato) Co and water vapor are 60 seconds. Purge times are 120 seconds. Nitrogen is used to transport the precursors to the deposition chamber and as the inert purge. 60 ALD cycles are used to deposit the film, with a ratio of 6 Zr cycles to 1 Co cycle. The resulting particles exhibit a uniform coating of CDZ.

Example 3

A cobalt doped zirconia (CDZ) film is deposited on LSCF contained in a rotating porous vessel at 160 rpm using tetrakisdimethylamido zirconium (TDMAZ) and bis(N,N'-di-i-propylacetamidinato) Co at 240° C. Nominal reactor pressure is 1 Torr. Dose times for TDMAZ, bis(N,N'-di-i-propylacetamidinato) Co and are 27 seconds, repeated 10 times as sub-doses for a single ALD cycle. Pressure is decreased below base pressure after each sub-dose and then a pressure pulse is momentarily introduced to approximately 55 Torr for 0.2 seconds, which occurs prior to a subsequent sub-dose. Water dose time is 70 seconds. Purge times are 720 seconds. Nitrogen is used to transport the precursors to the deposition chamber and as the inert purge. 12 ALD cycles are used to deposit the film, with a ratio of 6 Zr cycles to 1 Co cycle. The resulting particles exhibit a uniform coating of CDZ (FIG. 7).

Example 4

A cobalt doped zirconia (CDZ) film is deposited on LSCF in a fluidized bed in using tetrakisdimethylamido zirconium (TDMAZ) and bis(N,N'-di-i-propylacetamidinato) Co at 240° C. Reactor pressure is 1 Torr. Dose times for TDMAZ, bis(N,N'-di-i-propylacetamidinato) Co and water vapor are 60 seconds. Purge times are 120 seconds. Nitrogen is used to transport the precursors to the deposition chamber and as the inert purge. 60 ALD cycles are used to deposit the film, with a ratio of 6 Zr cycles to 1 Co cycle.

Example 5

A cobalt doped hafnia (CDH) film is deposited on LSCF in a fluidized bed in using tetrakisdimethylamido hafnium (TDMAH) and bis(N,N'-di-i-propylacetamidinato) Co at 240° C. Reactor pressure is 1 Torr. Dose times for TDMAH, bis(N,N'-di-i-propylacetamidinato) Co and water vapor are 60 seconds. Purge times are 120 seconds. Nitrogen is used to transport the precursors to the deposition chamber and as the inert purge. 60 ALD cycles are used to deposit the film, with a ratio of 6 Hf cycles to 1 Co cycle.

Example 6

A hafnia film is deposited on LSCF in a fluidized bed in using tetrakisdimethylamido hafnium (TDMAH) and bis(N, N'-di-i-propylacetamidinato) Co at 240° C. Reactor pressure is 1 Torr. Dose times for TDMAH, bis(N,N'-di-i-propylacetamidinato) Co and water vapor are 60 seconds. Purge times are 120 seconds. Nitrogen is used to transport the precursors to the deposition chamber and as the inert purge. 60 ALD cycles are used to deposit the film, with a ratio of 6 Hf cycles to 1 Co cycle.

Example 7

A cobalt doped hafnia (CDH) film is deposited on LSCF contained in a rotating porous vessel at 160 rpm using tetrakisdimethylamido hafnium (TDMAH) and bis(N,N'-di-i-propylacetamidinato) Co at 240° C. Nominal reactor pressure is 1 Torr. Dose times for TDMAH, bis(N,N'-di-i-propylacetamidinato) Co and are 27 seconds, repeated 10 times as sub-doses for a single ALD cycle. Pressure is decreased below base pressure after each sub-dose and then a pressure pulse is momentarily introduced to approximately 55 Torr for 0.2 seconds, which occurs prior to a subsequent sub-dose. Water dose time is 70 seconds. Purge times are 720 seconds. Nitrogen is used to transport the precursors to the deposition chamber and as the inert purge. 6 ALD cycles are used to deposit the film, with a ratio of 6 Hf cycles to 1 Co cycle.

Figure 9:
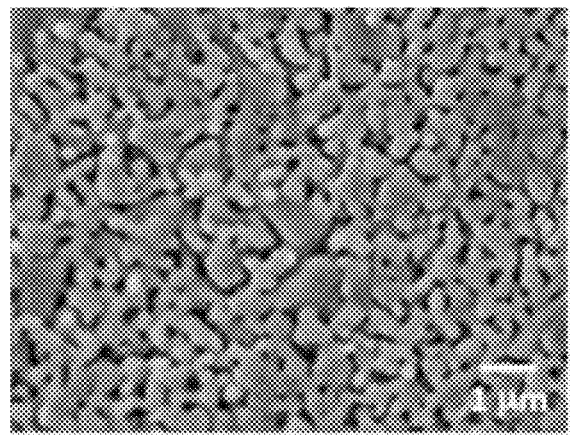
FIG. 9 is a scanning electron micrograph of a sintered cathode of LSCF fabricated from LSCF particles coated with cobalt doped zirconia (CDZ).
Figure 10:
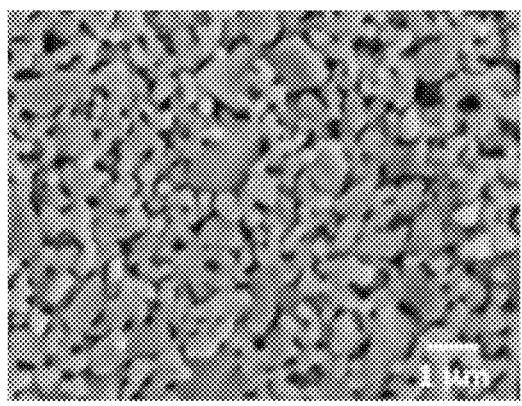
FIG. 10 is a scanning electron micrograph of a sintered cathode of LSCF fabricated from untreated LSCF particles.
Figure 12:
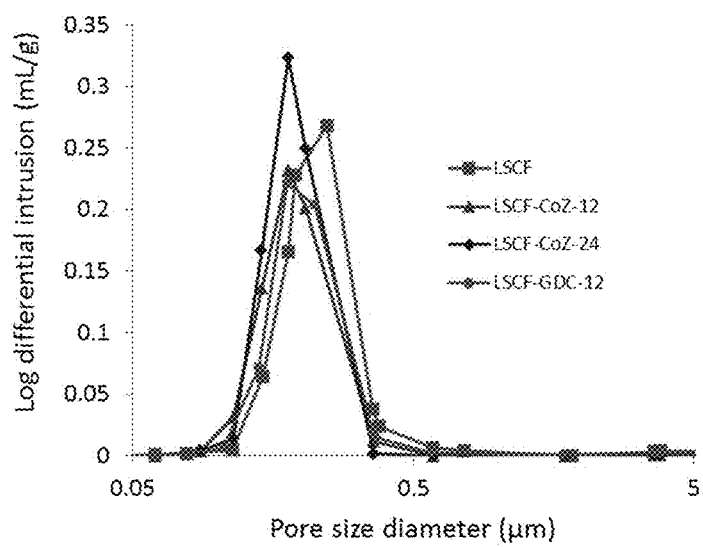
FIG. 12 depicts pore size distributions from cathodes sintered from uncoated and surface modified cathode powders sintered under the same conditions.

Sintering behavior of the coated particles from example 3 resulted in a desired open porous structure (FIG. 9) with similar morphology to a cathode sintered from untreated LSCF powder (FIG. 10). Both cathodes were sintered under identical conditions (1 hr @ 1000° C.). Furthermore, pore volume and pore size distribution, characterized by pycnometry and mercury probe analysis, were only slightly changed from a baseline cathode sintered from the same lot of LSCF powder under the same conditions as the surface treated cathode powder (1 hr @ 1000° C.). Pore volume is shown in FIG. 11 for LSCF cathode powders modified with CDZ via 12 and 24 cycles of ALD. The maximum change in pore volume was 6.6% for the powder treated with 24 cycles of CDZ by ALD compared to uncoated cathode material. The pore size distribution was also quite similar for cathodes sintered from untreated powder and those with surfaces modified by CDZ via ALD (FIG. 12).

Figure 13:
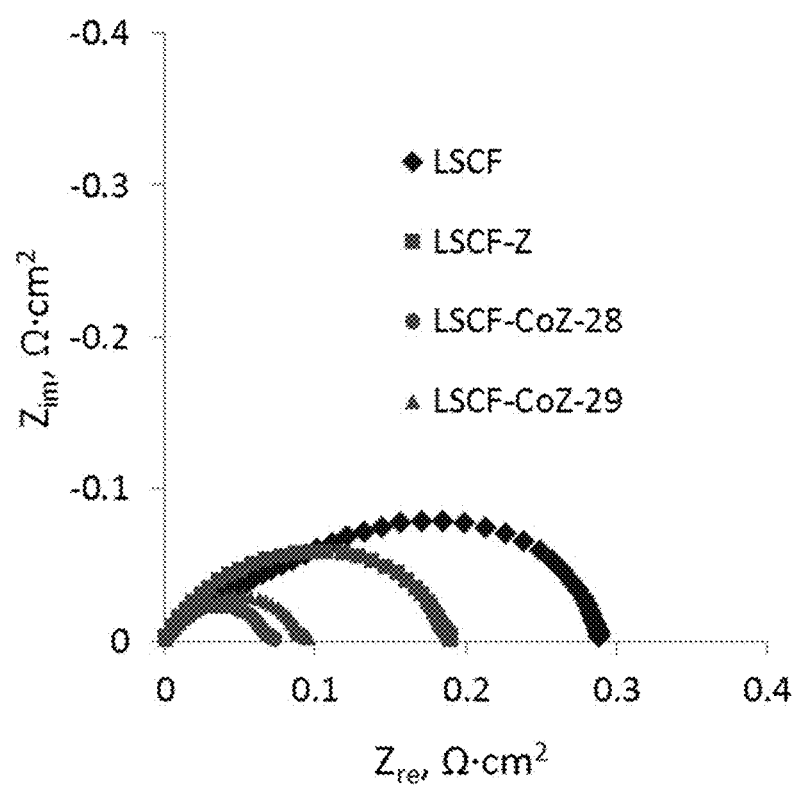
FIG. 13 is a polarization plot from symmetrical electrochemical cells with cathodes made from uncoated and several surface modified LSCF powders.

Impedance spectroscopy of symmetrical electrochemical cells using a scandium doped zirconia electrolyte, GDC barrier layers disposed on the electrolytes, and electrodes fabricated from ALD surface modified LSCF showed markedly improved polarization behavior compared to similar cells fabricated with uncoated powders (FIGS. 13 & 14). A cell fabricated with zirconia ALD coated powder showed decreases in polarization of 22%, 34%, and 41% at 800° C., 700° C., and 600° C., respectively, compared to an uncoated powder. Cathodes fabricated from particles coated with cobalt doped zirconia (CDZ) showed further substantial improvements compared to those fabricated from uncoated powders. Cathodes fabricated from LSCF powder with surfaces modified by 12 cycles of ALD CDZ showed decreases in polarization of 61%, 74%, and 77% at 800° C., 700° C., and 600° C., respectively, compared to an uncoated powder. Cathodes fabricated from LSCF powder with surfaces modified by 24 cycles of ALD CDZ showed decreases in polarization of 55%, 66%, and 68% at 800° C., 700° C., and 600° C., respectively, compared to an uncoated powder.

The subject invention may be embodied in the forgoing examples that are by no means restrictive, but intended to illustrate the invention.

What is claimed is:

1. An electrochemical cell cathode, the cathode comprising; sintered oxide powder particles, the oxide powder particles having a surface modifying layer applied to substantially all of the surfaces of the oxide powder particles prior to sintering the oxide powder particles, the surface modifying layer comprised of individually applied sublayers, each sublayer separately oxidized, the surface modifying layer reducing the total electrochemical polarization of the cathode formed by sintering the oxide powder particles, the surface modifying layer comprising hafnium oxide.

2. The surface modifying layer of claim 1 where the surface modifying layer consists of hafnium oxide.

3. The surface modifying layer of claim 1 where each sublayer comprises at least one of a Group IVB oxide.

4. The surface modifying layer of claim 1 where each sublayer comprises at least one of a transition metal oxide.

5. The surface modifying layer of claim 1 where the surface modifying layer comprises an oxide with dual conductivity modes of ionic and electronic conductivity.

6. The surface modifying layer of claim 1 where the surface modifying layer comprises zirconium oxide.

7. The surface modifying layer of claim 1 where the surface modifying layer comprises at least one of cobalt oxide, iron oxide and nickel oxide.

8. The surface modifying layer of claim 1 wherein the oxide powder particles comprise a lanthanum strontium based material.

9. The surface modifying layer of claim 1 wherein the oxide powder particles comprise lanthanum strontium cobalt iron oxide.

10. The surface modifying layer of claim 1 wherein the total polarization of a cathode in an electrochemical cell is reduced by at least 10% relative to the polarization of a cathode composed of the same sintered oxide powder particles without the surface modifying layer.

11. The surface modifying layer of claim 1 wherein the total polarization of a cathode in an electrochemical cell is reduced by at least 25% relative to the polarization of a cathode composed of the same sintered oxide powder particles without the surface modifying layer.

12. The surface modifying layer of claim 1 wherein the total polarization of a cathode in an electrochemical cell is reduced by at least 50% relative to the polarization of a cathode composed of the same sintered oxide powder particles without the surface modifying layer.

13. The surface modifying layer of claim 1 wherein the pore volume of a cathode in an electrochemical cell is not changed by more than 30% relative to the pore volume of a cathode composed of the same sintered oxide powder particles without the surface modifying layer.

14. The surface modifying layer of claim 1 wherein the pore volume of a cathode in an electrochemical cell is not changed by more than 20% relative to the pore volume of a cathode composed of the same sintered oxide powder particles without the surface modifying layer.

15. The surface modifying layer of claim 1 wherein the pore volume of a cathode in an electrochemical cell is not changed by more than 10% relative to the pore volume of a cathode composed of the same sintered oxide powder particles without the surface modifying layer.

16. A solid oxide fuel cell, comprising; a cathode formed by the process of claim 1.

17. A method to produce an electrochemical cell cathode, the method comprising; placing oxide powder particles in an atomic layer deposition reactor, heating, the oxide powder particles, depositing a surface modifying layer comprising hafnium oxide on substantially all of the surfaces of the oxide powder particles by carrying out at least two cycles of depositing a sublayer comprising hafnium and separately oxidizing the sublayer, thereby forming coated particles, removing the coated particles from the atomic layer deposition reactor, and sintering the coated particles to form the electrochemical cell cathode, the surface modifying layer thereby reducing the total electrochemical polarization of the cathode.

18. The method of claim 17 wherein the oxide powder particles comprise lanthanum and strontium.

19. The method of claim 17 further comprising placing the electrochemical cell cathode into a symmetric electrochemical cell, heating the electrochemical cell to a temperature of 700° C, and measuring the polarization of the electrochemical cell cathode using impedance spectroscopy, obtaining a polarization of 0.190 $\Omega$-cm$^2$ or less.

20. The method of claim 17 wherein during the step of hearing the oxide powder particles the oxide powder particles are heated to a temperature between 150-250° C.

* * * * *